United States Patent
Clark et al.

(10) Patent No.: US 7,324,913 B2
(45) Date of Patent: Jan. 29, 2008

(54) METHODS AND APPARATUS FOR TESTING A LINK BETWEEN CHIPS

(75) Inventors: Scott Douglas Clark, Rochester, MN (US); Dorothy Marie Thelen, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/344,902

(22) Filed: Feb. 1, 2006

(65) Prior Publication Data
US 2007/0179733 A1 Aug. 2, 2007

(51) Int. Cl.
*G06F 19/00* (2006.01)
(52) U.S. Cl. .............. 702/122; 73/865.9; 324/500; 324/512; 324/527; 324/537; 324/538; 324/539; 324/543; 702/108; 702/117; 714/1; 714/25; 714/43
(58) Field of Classification Search ............... 73/865.9; 324/500, 512, 527, 537, 539, 543, 538; 702/108, 702/117, 122; 714/1, 25, 37, 43
See application file for complete search history.

(56) References Cited

U.S. PATENT DOCUMENTS

| | | | | | |
|---|---|---|---|---|---|
| 4,617,657 | A | * | 10/1986 | Drynan et al. | 370/394 |
| 5,574,849 | A | * | 11/1996 | Sonnier et al. | 714/12 |
| 5,867,501 | A | * | 2/1999 | Horst et al. | 370/474 |
| 6,151,689 | A | * | 11/2000 | Garcia et al. | 714/49 |
| 6,816,987 | B1 | * | 11/2004 | Olson et al. | 714/704 |
| 7,068,681 | B2 | * | 6/2006 | Chang et al. | 370/474 |
| 2001/0040912 | A1 | * | 11/2001 | Gibbons et al. | 375/133 |
| 2003/0229844 | A1 | * | 12/2003 | Bansal et al. | 714/821 |
| 2004/0120348 | A1 | * | 6/2004 | Chang et al. | 370/474 |
| 2005/0259696 | A1 | * | 11/2005 | Steinman et al. | 370/535 |
| 2005/0286561 | A1 | * | 12/2005 | Chang et al. | 370/474 |

FOREIGN PATENT DOCUMENTS

JP 02-143738 A * 6/1990

* cited by examiner

*Primary Examiner*—Edward R Cosimano
(74) *Attorney, Agent, or Firm*—Dugan & Dugan

(57) ABSTRACT

In a first aspect, a first method of testing a link between a first chip and a second chip is provided. The first method includes the steps of, while operating in a test mode, (1) transmitting test data of sufficient length to enable exercising of worst case transitions from the first chip to the second chip via the link; and (2) performing cyclic redundancy checking (CRC) on the test data to test the link. Numerous other aspects are provided.

5 Claims, 3 Drawing Sheets

METHODS AND APPARATUS FOR TESTING A LINK BETWEEN CHIPS

FIELD OF THE INVENTION

The present invention relates generally to computer systems, and more particularly to methods and apparatus for testing a link between chips.

BACKGROUND

A conventional computer system may include a first chip coupled to a second chip via a link (e.g., through a chip input/output (I/O) interface) that may, for example, be one to six bytes wide. While the conventional computer system operates in a test mode, the first chip may generate a known bit pattern and transmit the bit pattern to the second chip via the link. Additionally, the second chip may store bits of the known bit pattern in a buffer. After the second chip receives each bit of the bit pattern via the link, the bits may be compared via compare logic against corresponding bits of the known bit pattern stored in the buffer of the second chip. If all bits of the bit pattern received in the second chip via the link match respective bits of the known bit pattern stored in the buffer, the link and first and second chips may be deemed not faulty. Alternatively, if one or more bits of the bit pattern received in the second chip via the link do not match respective bits stored in the buffer, the link, first chip and/or second chip may be faulty. In this manner, the link, first chip and second chip may be tested. However, such a testing method requires the second chip to include additional logic (e.g., the buffer and/or compare logic), and therefore, inefficiently consumes chip area.

Accordingly, improved methods and apparatus for testing a link are desired.

SUMMARY OF THE INVENTION

In a first aspect of the invention, a first method of testing a link between a first chip and a second chip is provided. The first method includes the steps of, while operating in a test mode, (1) transmitting test data of sufficient length to enable exercising of worst case transitions from the first chip to the second chip via the link; and (2) performing cyclic redundancy checking (CRC) on the test data to test the link.

In a second aspect of the invention, a first apparatus for testing a link between a first chip and a second chip is provided. The first apparatus includes (1) a link; and (2) cyclic redundancy checking (CRC) logic coupled to the link. The apparatus is adapted to, while operating in a test mode, (a) transmit test data of sufficient length to enable exercising of worst case transitions from the first chip to the second chip via the link; and (b) perform CRC on the test data to test the link.

In a third aspect of the invention, a first system for testing a link is provided. The first system includes (1) a first chip including a first portion of cyclic redundancy checking (CRC) logic; (2) a second chip including a second portion of the CRC logic; and (3) a link coupled to the first and second chips. The system is adapted to, while operating in a test mode, (a) transmit test data of sufficient length to enable exercising of worst case transitions from the first chip to the second chip via the link; and (b) test the link by performing CRC on the test data using the CRC logic. Numerous other aspects are provided, as are systems and apparatus in accordance with these and other aspects of the invention.

Other features and aspects of the present invention will become more fully apparent from the following detailed description, the appended claims and the accompanying drawings.

DETAILED DESCRIPTION

Figure 1:
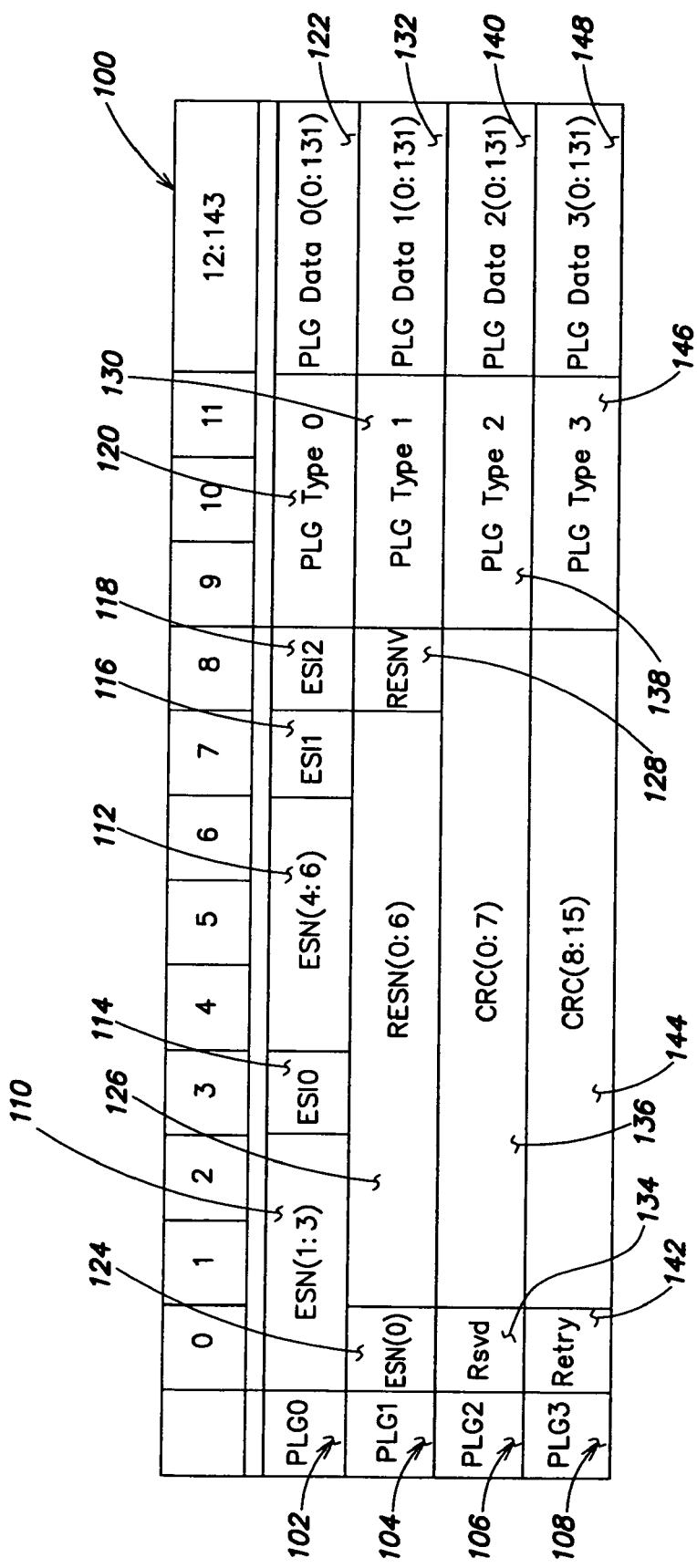
FIG. 1 illustrates a first exemplary packet structure employed to transmit data during a functional mode in accordance with an embodiment of the present invention.

The present invention provides improved methods and apparatus for testing a link, which may include differential wire pairs. More specifically, the present invention provides a system including a first chip coupled to a second chip via a link. In a functional mode, the system is adapted to transmit data packets of a first fixed size (e.g., via the link). However, the system (e.g., a link thereof) may not be tested effectively using packets of the first fixed size because packets of the first fixed size may not include enough (e.g., at least a minimum number of) contiguous bits to effectively perform a stress test on and/or debug the system. For example, packets of the first fixed size may not include enough bits to enable exercising of worst case scenario transitions. Consequently, assuming data is transferred from the first chip to the second chip, the first chip may include transmit logic adapted to generate data packets of a second fixed size when the system operates in a test mode. The second fixed size may be larger than the first fixed size. Further, the transmit logic may be adapted to compute a CRC value for a data packet of the second fixed size and insert such CRC value into the packet. The transmit logic may transmit such a packet to the second chip via the link.

The second chip may include receive logic adapted to receive such a packet. Further, the receive logic may be adapted to compute a CRC value for the received packet of the second fixed length, and compare the computed CRC value with the CRC value inserted in the data packet by the transmit logic. The data packet of the second fixed size may enable enough contiguous bits of a bit pattern (generated by the first chip) to be stored therein such that the system may effectively be stress tested and/or debugged. For example, by employing a data packet of the second fixed size to store the bit pattern, when data of such a packet is transmitted across the link such data may include enough contiguous bits to effectively stress test and/or debug the system. Further, by employing CRC to transmit data in the test mode, the system may not have to perform the bit-by-bit comparison performed by the conventional system, and therefore, the receive logic does not require a buffer to store the test pattern generated by the first chip. Consequently, an amount of logic included in chips of the present system, and therefore, chip space consumed by such logic, may be reduced (compared to conventional systems).

By employing data packets of the second fixed size to transmit data via the link during system testing and performing CRC on data transmitted during system testing, the present invention provides improved methods and apparatus for testing a link. It should be noted, the second chip may include the transmit logic described above and the first chip may include the receive logic described above so data may also be transmitted from the second chip to the first chip. In some embodiments, the first chip may transmit data to itself via the link (e.g., do a loopback).

FIG. 1 illustrates a first exemplary packet structure employed to transmit data during a functional mode in accordance with an embodiment of the present invention. With reference to FIG. 1, the first exemplary packet 100 may be employed by a system including a link between a first and a second chip to store and transmit data while operating in a functional mode. The first exemplary packet 100 may be of a fixed length and may include fields (among other fields) adapted to store one or more portions of a packet sequence number, a start of packet indicator (e.g., an envelope sequence indicator (ESI)), a cyclic redundancy checking (CRC) value. To successfully test the link, at least a predetermined minimum number (e.g., twelve or another suitable number) of contiguous user-defined data bits (e.g., test data bits) may be transmitted on the link. However, the first exemplary packet structure may not provide for (e.g., allow) the predetermined minimum number of contiguous user-defined data bits to be transmitted on the link. More specifically, while transmitting the first exemplary packet 100, a stream of user-defined data bits may be interrupted by start-of-packet indicator bits, CRC bits or the like. Therefore, the link may not be tested as desired.

For example, the first exemplary packet 100 may be seventy-two bytes in size (although a larger or smaller size may be employed). More specifically, the first exemplary packet 100 may include four physical layer groups (PLGS) each of which may be eighteen bytes wide (e.g., 144 bits wide). For example, the first exemplary packet structure 100 may include a first through fourth PLG0-PLG3 102-108. However, the first exemplary packet 100 may include a larger or smaller number of PLGs each of which may be larger or smaller. The first PLG 102 may include fields 110, 112 adapted to store second and third portions, respectively, of a sequence number (e.g., an envelope sequence number (ESN)) associated with the packet 100. As described below, a first portion of the ESN may be stored in the second PLG 104. Additionally, the first PLG 102 may include fields 114-118 adapted to store a first through third start of packet indicators (e.g., ESI0-ESI2), respectively. Additionally, the first PLG 102 may include a PLG Type 0 field 120 and a PLG Data 0 field 122 which are adapted to store user-defined data (UDD).

The second PLG 104 may include a field 124 adapted to store the first portion of the ESN. Additionally, the second PLG 104 may include a field 126 adapted to store a return envelope sequence number (RESN) which may serve as an ESN acknowledge field. The second PLG 104 may include a field 128 adapted to store an RESN valid (RESNV) field 128 which may indicate whether the RESN is valid. Further, the second PLG 104 may include a PLG Type 1 field 130 and a PLG Data 1 field 132 which are adapted to store user-defined data.

The third PLG 106 may include a reserved field 134 (Rsvd) and a field 136 adapted to store a first portion of a CRC value calculated based on the user-defined data included in the packet 100. Additionally, the third PLG 106 may include a PLG Type 2 field 138 and a PLG Data 2 field 140 which are adapted to store user-defined data.

The fourth PLG 108 may include a retry field 142 adapted to store data such that a receiving chip can request that a transmitting chip resend a particular packet (and subsequent packets) if the receiving chip determines it may not process the packet at a given time (e.g., due to lack of buffer space to store the contents). Data in the retry field 142 may be used in conjunction with data stored in the RESN field 126 to inform the transmitting chip from which packet to start retransmission. Further, the fourth PLG 108 may include a field 144 adapted to store a second portion of the CRC value calculated based on the user-defined data included in the packet 100. Additionally, the fourth PLG 108 may include a PLG Type 3 field 146 and a PLG Data 3 field 148 which are adapted to store user-defined data. In some embodiments, aside from the ESI and CRC fields 114, 116, 118, 136, 144, any field may be employed to store UDD.

The field 110 for storing the second portion of the ESN may be 3 bits wide, the field 114 for storing the ESI0 may be 1 bit wide, the field 112 for storing the third portion of the ESN may be 3 bits wide, the field 116 for storing ESI1 may be 1 bit wide, the field 118 for storing ESI2 may be 1 bit wide, the field 124 for storing the first portion of the ESN may be 1 bit wide, the field 126 for storing RESN may be 7 bits wide, the field 128 for storing RESNV may be 1 bit wide, the reserved field 134 may be 1 bit wide, the field 136 for storing the first portion of the CRC value may be 8 bits wide, the retry field 142 may be 1 bit wide, the field 144 for storing the second portion of the CRC value may be 8 bits wide. Additionally, each of the PLG Type 0-PLG Type 3 fields may be 3 bits wide and each of the PLG Data 0-PLG Data 3 fields may be 132 bits wide. However, one or more of the above-described fields may be larger or smaller.

Due to the above-described internal representation of the first exemplary packet 100, the first exemplary packet structure may not allow the predetermined minimum number of contiguous user-defined data bits which may be required to test the link to be transmitted on the link. More specifically, while transmitting the first exemplary packet 100 via the link, a stream of user-defined bits may be interrupted by start-of-packet indicator bits, CRC bits or the like. Therefore, the link may not be tested as desired. To wit, test data desired to be transmitted via the link may not fit in a single first exemplary packet, and may have to be transmitted using multiple first exemplary packets. Consequently, a new packet structure to be employed while testing the link is desired.

Figure 2:
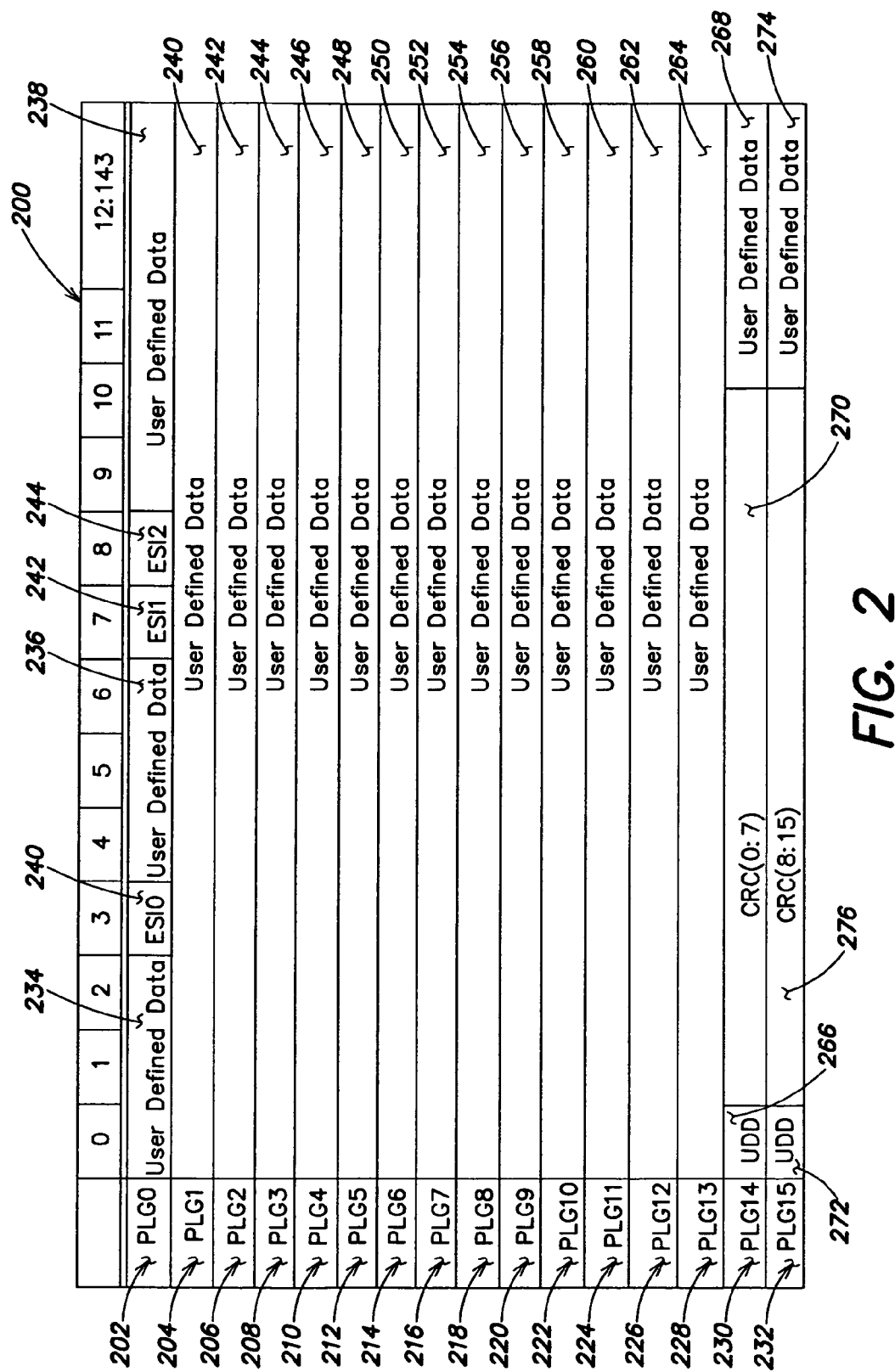
FIG. 2 illustrates a second exemplary packet structure employed to transmit data during a test mode in accordance with an embodiment of the present invention.

FIG. 2 illustrates a second exemplary packet structure employed to transmit data during a test mode in accordance with an embodiment of the present invention. With reference to FIG. 2, the second exemplary packet 200 may be employed by the system including the link between the first and the second chip to store and transmit data while operating in a test mode. Similar to the first exemplary packet 100, the second exemplary packet 200 may be of a fixed length and may include fields adapted to store one or more portions of at least one start of packet indicator (e.g., an envelope sequence indicator (ESI)), a cyclic redundancy checking (CRC) value and user-defined data. Further, in contrast to the first exemplary packet 100, the structure of the second exemplary packet 200 may enable at least a predetermined minimum number of contiguous user-defined data bits, which are required to successfully test (e.g., debug or stress test) the link, to be transmitted on the link. More specifically, while transmitting the second exemplary packet 200, a stream of user-defined bits may be uninterrupted by start-of-packet indicator bits, CRC bits or the like.

For example, the second exemplary packet structure 200 may be 288 bytes in size (although a larger or smaller size may be employed). More specifically, the second exemplary packet structure 200 may include sixteen physical layer groups (PLGS) each of which may be eighteen bytes wide (e.g., 144 bits wide). For example, the second exemplary packet 200 may include a first through sixteenth PLG0-PLG15 202-232. However, the second exemplary packet 200 may include a larger or smaller number of PLGs each of which may be larger or smaller. The first PLG 202 may include first through third fields 234, 236, 238 adapted to store user-defined data, and first through third fields 240, 242, 244 adapted to store start of packet indicators ESI0-ESI2, respectively. Additionally, a plurality of sequential or contiguous PLGs 202-232 of the second data packet 200 may serve to store (e.g., exclusively) user-defined data. For example, the second through fourteenth PLGs PLG1-PLG13 may include fields 240-264, respectively, adapted to store user-defined data. Further, the second data packet 200 may include a fifteenth PLG 230 that may include first and second fields 266, 268 adapted to store user-defined data and a field 270 adapted to store a first portion of a CRC value calculated based on the user-defined data included in the packet 200.

Further, the second data packet 200 may include a sixteenth PLG 232 that may include first and second fields 272, 274 adapted to store user-defined data and a field 276 adapted to store a second portion of a CRC value calculated based on the user-defined data included in the packet 200.

In the first PLG 202, the field 234 for storing UDD may be 3 bits wide, the field 240 for storing ESI0 may be 1 bit wide, the field 236 for storing UDD may be 3 bits wide, the field 242 for storing ESI1 may be 1 bit wide, the field 244 for storing ESI2 may be 1 bit wide and field 238 for storing UDD may be 135 bits wide. Fields 240 through 264 for storing UDD, respectively, may each be 18 bytes (e.g., 144 bits wide). In the fifteenth PLG 230, the field 266 adapted to store UDD may be 1 bit wide, the field 270 adapted to store the first portion of the CRC value may be 8 bits wide and the field 268 adapted to store UDD may be 135 bits wide. Similarly, in the sixteenth PLG 232, the field 272 adapted to store UDD may be 1 bit wide, the field 276 adapted to store the second portion of the CRC valve may be 8 bits wide, and the field 274 adapted to store UDD may be 135 bits wide. However, one or more of the above-described fields may be larger or smaller. Additionally, the second exemplary packet 200 may include a larger or smaller number of and/or different fields as long as the structure of the second exemplary packet 200 may enable a predetermined minimum number of contiguous user-defined data bits, which are required to successfully test (e.g., debug or stress test) the link, to be transmitted on the link. Due to the above-described internal representation of the second exemplary packet 200, the second exemplary packet structure may enable the predetermined minimum number of contiguous user-defined data bits to be transmitted on the link. More specifically, while transmitting the second exemplary packet 200, a stream of UDD bits may be uninterrupted by start-of-packet indicator bits, CRC bits or the like. To wit, the second exemplary packet 200 may include enough bits to enable exercising of worst case transitions. Therefore, the link may be tested as desired using the second data packet structure.

Figure 3:
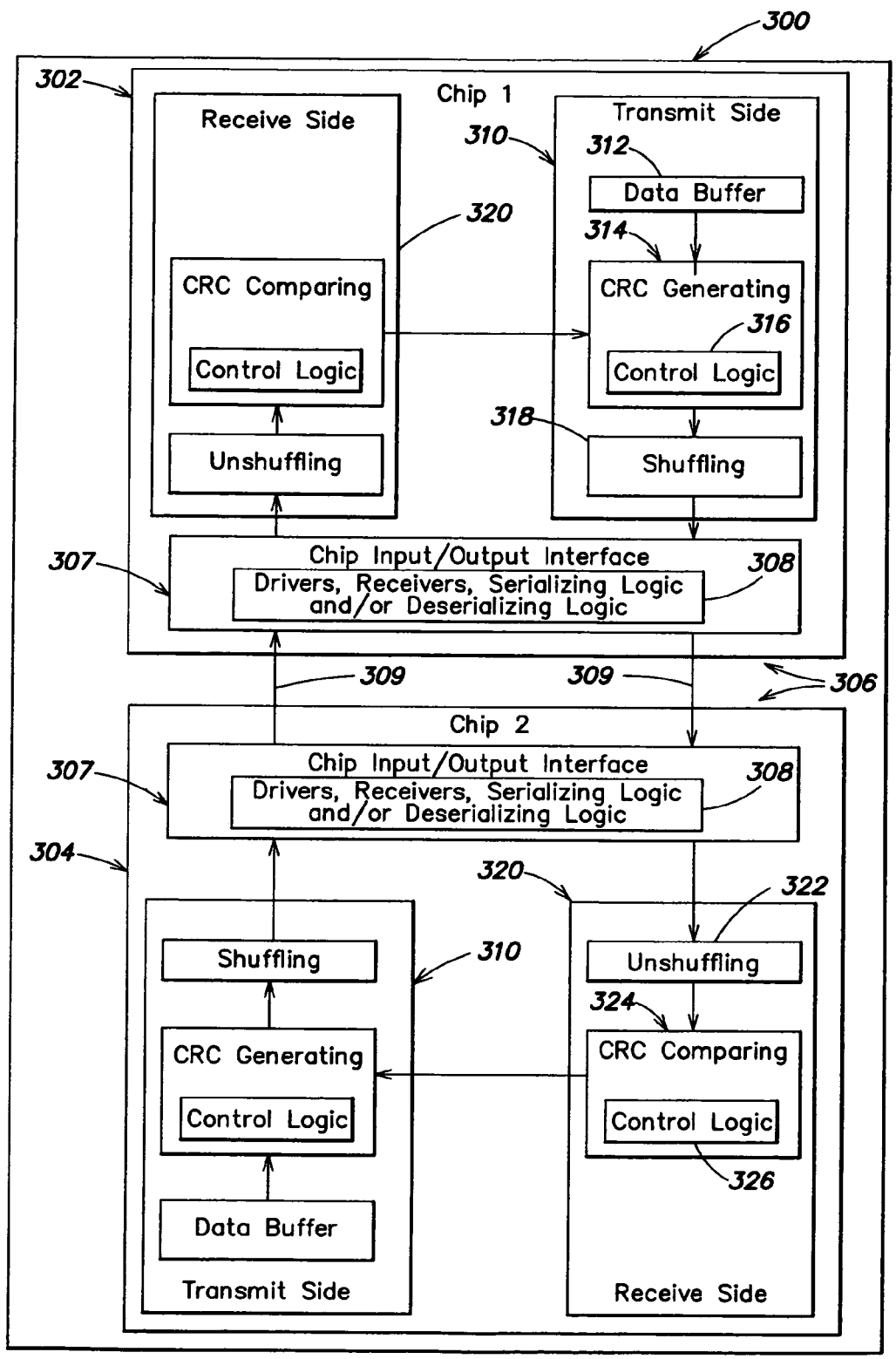
FIG. 3 illustrates a block diagram of a system adapted to test a link between chips of the system in accordance with an embodiment of the present invention.

An exemplary system which may employ the first and second data packets 100, 200 is described below with reference to FIG. 3. FIG. 3 illustrates a block diagram of a system adapted to test a link between chips of the system in accordance with an embodiment of the present invention. With reference to FIG. 3, the system 300 may include a first chip 302 coupled to a second chip 304 via a link 306 (e.g., a high speed chip-to-chip link). The link 306 may be or include a chip input/output (I/O) interface 307 in each chip 302, 304 adapted to receive data output from such chip 302, 304 and to input data to the chip 302, 304. The I/O interface 307 may include one or more drivers, receivers, serializing logic and/or deserializing logic 308 adapted to enable the above-described communication. Further, the link 306 may include wires 309 coupling the chips 302, 304. The I/O interface 307 may be an improved version of the existing I/O interface included in the Cell BE processor manufactured by the assignee of the present invention, IBM Corporation of Armonk, N.Y. In some embodiments, the first chip 302 may serve to transmit data and the second chip 304 may serve to receive data. Therefore, the first chip 302 may include transmit side logic 310 adapted to encapsulate data into a packet (e.g., while operating in a test mode), calculate a first CRC value based on data included in the packet, insert the first CRC value into the packet, and transmit the data packet to the second chip 304 via the link 306. More specifically, the transmit side logic 310 may include a data buffer 312 coupled to logic 314 adapted to generate a CRC value based on data included in a packet (hereinafter "CRC generating logic"). The data buffer 312 may be adapted to store data to be transmitted on the link. Such data may be encapsulated into the first packets 100. Additionally, such data may include one or more packets that should be retransmitted due to a link error, for example.

Data output from the data buffer 312 may be input by the CRC generating logic 314. The system 300 may be adapted to operate in a functional mode and a test mode. When operating in the functional mode, the system 300 may operate on and transmit (e.g., via the link 306) data encapsulated using the first exemplary packet structure. Alternatively, when operating in the test mode, the system 300 may operate on and transmit (e.g., via the link 306) data encapsulated using the second exemplary packet structure. Therefore, when the system 300 operates in the functional mode, the CRC generating logic 314 may receive data encapsulated using the first exemplary data packet structure from the data buffer 312. Upon receiving such a first exemplary data packet 100, the CRC generating logic 314 may calculate a first CRC value based on data included in the first exemplary packet 100, and insert the first CRC value into the packet 100. Thereafter, the packet 100 may be output from the CRC generating logic 314 to be transmitted via the link 306.

Alternatively, when the system 300 operates in the test mode, the CRC generating logic 314 may receive data encapsulated using the first exemplary data packet structure from the data buffer 312 and encapsulate such data using the second exemplary packet data structure. To encapsulate such data into the second exemplary packet 200, the CRC generating logic 314 may include control logic 316 (e.g., a counter of the like) adapted to enable the CRC generating logic 314 to calculate a first CRC value based on data included in a data packet, such as the second exemplary data packet 200, that is longer (e.g., four times longer) than the first exemplary data packet 100. For example, when the system 300 operates in the test mode, the control logic 316 may reduce a frequency with which a CRC value is reset to accommodate for the increased length of the second exemplary data packet 200. The CRC generating logic 314 may calculate a first CRC value based on data included in the second exemplary packet 200, and insert the first CRC value into the packet 200. Therefore, the packet 20 ma be output from the CRC generating logic 314 to be transmitted via the link 306. However, an alternate method of generating the CRC may be employed. In some embodiments, the transmit side logic 310 may not compute the CRC value. For example, the CRC value for the data packet of the second fixed size may be manually calculated and placed in the data buffer 312 with the packet data. In such embodiments, the CRC generating logic 314 may be bypassed while in test mode so as not to replace the manually-calculated CRC.

The CRC generating logic 314 may be coupled to logic 318 (hereinafter "shuffling logic") adapted to shuffle or multiplex a data packet such that the data packet may be transmitted via the link 306. For example, the shuffling logic 318 may partition the data packet into portions of data to be transmitted via the link 306. In this manner, such data transmitted via the link 306 may be interleaved.

For example, the link 306 may be a six-byte-wide interface that employs differential wire pairs to transmit a bit of data. However, the link 306 may be larger or smaller (e.g., anywhere from one-byte-wide to about six-bytes-wide). Additionally or alternatively, the link 306 may be a single-ended interface (e.g., an interface that does not employ differential wire pairs to transmit a bit of data). If the link 306 operated on a packet-based protocol where each packet is 72 bytes in length (e.g., operates on the first exemplary data packets 100) in the functional mode, when transmitting such a packet across a six-byte-wide link 306, each one-byte-portion of the link 306 would transmit 12 bytes of the packet 100, and therefore, each differential wire pair forming such portion would transmit or carry 12 bits of the packet 100. Such a packet 100 would be internally transmitted as a set of four 18 byte Physical Layer Groups (PLGs). When transmitting such a packet 100 via the link 306, the ESI bits and CRC bits would be present for a receiving chip (e.g., the second chip 304) to delineate a packet boundary and verify integrity of the data, respectively. Remaining data would be used to transmit user-defined data for the purposes of link characterization and test. However, when transmitting across a six-byte-wide interface 308, some portions thereof (e.g., some differential wire pairs) would only be able to control fewer than a predetermined minimum number (e.g., twelve) of bits in succession, which are required to test the link (although the predetermined minimum number may be larger or smaller). Consequently, the system 300 would be unable to create bitstreams of interest when employing the first exemplary packet structure in the test mode. For example, some wire pairs would transmit an ESI bit on a second bit of the packet and CRC bits on the final four bits of the packet. Thus, the system 300 would only be able to control six successive bits, which is insufficient to successfully test the link 306.

Consequently, the second exemplary data packet structure is employed to transmit data in the test mode. As described above the fixed length second exemplary packet 200 may be 288 bytes long, which is four times the length of the first exemplary packet 100 (e.g., the standard packet). However, as described above, similar to the first exemplary packet 100, the second exemplary packet 200 may include ESI and CRC fields to delineate the packet 200 and verify the integrity of the data included therein. Remaining bits may all be user-defined data. Consequently, in contrast to transmitting the first exemplary data packet 100, when transmitting the second exemplary data packet 200 over a six byte interface 308, each differential wire pair may transmit 48 bits of sequential data within the packet 200. On wire pairs that carry ESI and CRC information, this still results in 42 bits of sequential data that can be controlled. Consequently, employing the second exemplary data packet 200 may enable the link 306 to transmit sequential data having seven times the length of sequential data transmitted using the first exemplary packet 100. To wit, the second exemplary packet may include enough bits to enable exercising of worst case transitions.

For example, during a first clock cycle, a first, third, sixth, ninth, twelfth and fifteenth byte of a packet may be transmitted via the link 306. Thereafter, during a subsequent clock cycle (e.g., a second clock cycle), a second, fourth, seventh, tenth, thirteenth and sixteenth byte of the packet may be transmitted via the link 306, and so on. During the test mode, when the second exemplary packet structure is employed to transmit data via the link 306, a stream of UDD bits may be uninterrupted by start-of-packet indicator bits, CRC bits or the like. Consequently, the second exemplary packet structure may enable the predetermined minimum number of contiguous user-defined data bits to be transmitted on the link 306. Therefore, the link 306 may be tested as desired using the second data packet structure.

The second chip 304 may include receive side logic 320 adapted to receive data packets and determine whether such packets were successfully transmitted via the link 306 (e.g., while receiving the packets). More specifically, the receive side logic 320 may include logic 322 (hereinafter "unshuffling logic") adapted to unshuffle or demultiplex a data packet. For example, the unshuffling logic 322 may reassemble portions of a data packet received from the link 306 into the data packet. The unshuffling logic 322 may be coupled to logic 324 (hereinafter "CRC comparing logic") adapted to calculate a second CRC value based on data included in the data packet received by the receive side logic 320 and to compare the second CRC value with the first CRC value inserted into the packet by the CRC generating logic 314. Based on such a comparison, the system 300 may determine whether the data packet was successfully transmitted via the link 306 from the first chip 302 to the second chip 304. For example, if the first and second CRC values match, the data packet was successfully transmitted. Alternatively, if the first and second CRC values do not match, the data packet may have been unsuccessfully transmitted. For example, a link error may have caused transmission of the data packet to fail.

The CRC comparing logic 324 may include control logic 326 (e.g., a counter or the like) adapted to enable the CRC comparing logic 324 to calculate the second CRC value based on data included in the received data packet, such as a received second exemplary data packet 200, that is longer (e.g., four times longer) than the first exemplary data packet 100. For example, when the system 300 operates in the test mode, the control logic 326 may reduce a frequency with which a CRC value is reset to accommodate for the increased length of the second exemplary data packet 200.

The above-described link 306 may typically include or be coupled to performance-measuring facilities, such as counters or the like, to track a number of good packets received and/or a number of packets received with a CRC error when operating in functional mode. Such facilities may also be employed by the link 306 during test mode to quantify the quality of the link 306 during testing.

By employing CRC during the test mode, the receive side logic 320 may not have to perform a bit-by-bit comparison of data received via the link 306 with a known test data pattern that was encapsulated into a packet and transmitted by the transmit side logic 310. Therefore, the receive side logic 320 may not be required to store the known test data pattern in a local buffer, thereby eliminating the need for such a buffer. Consequently, the system 300 may reduce an amount of chip area consumed by the present invention. More specifically, the system 300 may reduce an amount of space on the second chip 304 consumed by the receive side logic 320.

Further, by employing the second exemplary data packet structure to transmit user-defined data (e.g., a known pattern of test data), the system 300 may be able to transmit at least a predetermined minimum number of contiguous user-defined data bits, which are required to successfully test the link 306, on the link 306. In this manner, the system 300 may debug the link 306 to determine a source of a problem with the link 306. Further, the system 300 may stress test (e.g., characterize) the link 306. The stress test may subject the link 306 to extreme scenarios (e.g., by exposing the link 306 to large voltage and/or temperature swings).

In the manner described above, the system 300 may transmit data from the first chip 302 to the second chip 304 via the link 306 and test such a link 306. However, in some embodiments, the second chip 304 may also include the transmit side logic 310 and the first chip 302 may also include the receive side logic 320 such that the system 300 may transmit data from the second chip 304 to the first chip 302 via the link 306. In such embodiments, the receive side logic 320 in the first chip 302 may be coupled to the transmit side logic 310 of the first chip 302 such that the receive side logic 320 may communicate information about received data (e.g., the ESN of the packets successfully received) to the transmit side logic 310. Such information may be placed in an outbound packet as the RESN so that the original transmitting chip knows that a particular packet with the corresponding ESN was received successfully. Similarly, the receive side logic 320 in the second chip 304 may be coupled to the transmit side logic 310 of the second chip 304 such that the receive side logic 320 may communicate information about received data (e.g., the ESN of the packets successfully received) to the transmit side logic 310.

Through use of the present methods and apparatus a system 300 may employ a first data packet structure along with CRC while operating in a functional mode and a second data packet structure along with CRC while operating in a test mode. By employing CRC while operating in the test mode, logic (e.g., the receive side logic 320) employed by the system 300 may consume less space on one or more chips 302, 304 of the system 300. Logic employed by the system 300 to perform CRC may be similar to existing CRC logic. More specifically, since CRC is a sequential running calculation based on a data stream, the CRC generating and comparing logic 314, 324 employed by the present methods and apparatus may be the same as existing logic with the exception of including logic 316, 326 adapted to modify termination or reset of the calculation to account for the longer packet length. All remaining reporting and debug logic, such as error counters and trace facilities, may require no change for operating in test mode (e.g. long packet mode) over existing CRC logic. Therefore, the present methods and apparatus may require almost no additional logic to support the long packets or envelopes.

Further, by employing the second data packet structure while operating in the test mode, the system 300 may yield a substantial benefit in controlling bitstreams being transmitted across a link under test. The system 300 is able to transmit at least a predetermined minimum number of contiguous user-defined data (e.g., test data) bits, which are required to successfully test the link 306, on the link 306. In this manner, the present methods and apparatus may extend fixed length packets of a first size (e.g., the first exemplary packet 100) into a "long packet" (e.g., the second exemplary packet 200) to enable sufficient length control over bitstreams transmitted via the link 306 while the system 300 operates in a test mode, thereby exercising the I/O link 306 for worst case transitions. In contrast, if the first exemplary data packet structure is employed while operating in the test mode, the link 306 may not be tested successfully because the first data packet structure is not large enough to create a suitable configurable bit stream because of the length of the packets and the delineation that is required on each packet. Consequently, while the system 300 operates in a test mode, the link 306 may be efficiently tested by using packets longer than those employed when the system 300 operates in a functional mode.

The foregoing description discloses only exemplary embodiments of the invention. Modifications of the above disclosed apparatus and methods which fall within the scope of the invention will be readily apparent to those of ordinary skill in the art. For instance, although the second chip 304 is different than the first chip 302, the present methods and apparatus may be employed when the second chip 304 is the same as the first chip 302 (e.g., when the first chip 302 transmits data to itself via the link 306.

Accordingly, while the present invention has been disclosed in connection with exemplary embodiments thereof, it should be understood that other embodiments may fall within the spirit and scope of the invention, as defined by the following claims.

The invention claimed is:

1. An apparatus adapted to operate in either a functional mode or a test mode, the test mode enabling testing of data communications transmitted from the apparatus comprising:
   an output interface adapted to transmit data; and
   cyclic redundancy checking (CRC) generating logic coupled to the output interface adapted, when the apparatus is operating the test mode, to:
   encapsulate test data in a packet of sufficient length to enable exercising of worst case transitions during communication into or out of the apparatus; and
   calculate a CRC value of the packet to enable a test of encapsulated data provided to the output interface and transmitted from the apparatus.

2. The apparatus of claim 1 wherein the CRC generating logic is further adapted to:
   employ one or more packets of a first size to encapsulate data to be delivered to the output interface for communication while the apparatus is operating in the functional mode; and
   employ one or more packets of a second size, larger than the first size, to encapsulate test data of sufficient length to enable exercising of worst case transitions while the apparatus is operating in the test mode;
   wherein the second packet size enables a predetermined minimum number of contiguous test data bits.

3. The apparatus of claim 2 wherein the CRC generating logic is further adapted to:
   before transmitting the test data while operating in the test mode:
      calculate a first CRC value based on portions of test data included in a packet of the second size to be transmitted; and
      insert the first CRC value in the packet of the second size to be transmitted.

4. The apparatus of claim 2 wherein the output interface is adapted to transmit at least a minimum number of contiguous test data bits to enable exercising of worst case transitions.

5. The apparatus of claim 4 wherein the output interface is adapted to transmit at least a minimum number of contiguous test data bits to enable at least one of stress test and debug the link.

* * * * *